US006465840B1

(12) United States Patent
Queirolo et al.

(10) Patent No.: US 6,465,840 B1
(45) Date of Patent: Oct. 15, 2002

(54) INTEGRATED STRUCTURE COMPRISING A PATTERNED FEATURE SUBSTANTIALLY OF SINGLE GRAIN POLYSILICON

(75) Inventors: Giuseppe Queirolo; Giovanni Ferroni, both of Milan (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/072,247

(22) Filed: May 4, 1998

(30) Foreign Application Priority Data

May 8, 1997 (EP) .............................. 97830212

(51) Int. Cl.$^7$ ......................................... H01L 29/788
(52) U.S. Cl. ....................................... 257/321; 257/532
(58) Field of Search ................................ 257/321, 532, 257/412

(56) References Cited

U.S. PATENT DOCUMENTS

| 4,214,918 A | * | 7/1980 | Gat et al. ..................... 148/1.5 |
| 4,874,716 A | * | 10/1989 | Rao ............................. 437/43 |
| 5,031,010 A | * | 7/1991 | Mikata et al. ............... 257/346 |
| 5,563,093 A | | 10/1996 | Koda et al. |
| 5,614,257 A | | 3/1997 | Beinglass et al. |
| 5,949,102 A | * | 9/1999 | Saida et al. .................. 257/316 |

FOREIGN PATENT DOCUMENTS

EP 0 274 390 A2 1/1988

OTHER PUBLICATIONS

Patent Abstracts of Japan, vol. 096, No. 010, Oct. 31, 1996, and JP 08 153808A (Oki Electric Ind. Co., Ltd.), Jun. 11, 1996.

Patent Abstracts of Japan, vol. 013, No. 016, Jan. 13, 1989, and JP 63 221681A (Mitsubishi Electric Corp.), Sep. 14, 1988 AM.

Patent Abstracts of Japan, vol. 014, No. 178, Apr. 10, 1990, and JP 02 031468A (NEC Corp. ), Feb. 1, 1990.

Kazuhiro Shimizu, et al., "*High–Mobility Poly–Si Thin–Film Transistors Fabricated by a Novel Excimer Laser Crystallization Method,*" IEEE Transactions on Electron Devices, vol. 40, No. 1, Jan. 1993, pp. 112–117.

Munetaka Koda, et al., "*Improving Gate Oxide Integrity in p+pMOSFET by Using Large Grain Size Polysilicon Gate,*" Proceedings of the International Electron Devices Meeting, Washington, Dec. 5–8, 1993, Institute of Electrical and Electronic Engineers, pp. 471–474.

\* cited by examiner

*Primary Examiner*—Mark V. Prenty
(74) *Attorney, Agent, or Firm*—Lisa K. Jorgenson; Allen, Dyer, Doppelt, Milbrath & Gilchrist, P.A.

(57) ABSTRACT

The electrical performance of a dielectric film for capacitive coupling in an integrated structure is enhanced by forming the polycrystalline electrically conductive layer coupled with the dielectric film substantially unigranular over the coupling area, commonly to be defined by patterning the stacked dielectric and conductive layers. The process forms a polycrystalline silicon film having exceptionally large grains of a size on the same order of magnitude as the dimensions of the patterned details. These exceptionally large grains are obtained by preventing the formation of "precursor nuclei" of subsequent grain formation and growth at the deposition interface with the dielectric that are apparently formed during the first instants of silicon CVD deposition and by successively growing the crystallites at a sufficiently low annealing temperature.

4 Claims, No Drawings

INTEGRATED STRUCTURE COMPRISING A PATTERNED FEATURE SUBSTANTIALLY OF SINGLE GRAIN POLYSILICON

FIELD OF THE INVENTION

This invention relates to techniques for polycrystalline silicon (polysilicon) deposition for the fabrication of a semiconductor integrated device, and, more particularly, to the formation of a layer of polysilicon on a dielectric layer.

BACKGROUND OF THE INVENTION

The scaling down toward ever smaller integrated structures and the consequent reduction of operating voltages, as well as of the thickness of dielectric layers for capacitive coupling, aggravates the criticality of residual imperfections in the dielectric. These imperfections occur during the process of formation of the dielectric layer and/or are induced in the dielectric film during the successive steps of fabrication of the integrated device that includes several different thermal treatments.

In highly critical dielectric layers, like for instance in the case of the tunnel oxide in a FLASH or EEPROM memory structure for the capacitive coupling between a floating gate patterned from a deposited polycrystalline silicon layer, eventually doped in-situ, and a drain region of the underlying monocrystalline silicon semiconductor, it is generally accepted that the dielectric properties may be affected by the characteristics of the layers interfacing or being coupled therewith. An interface layer may typically be polycrystalline silicon which is the conductor material interfaced to the dielectric film. Another critical dielectric layer is the so-called "interpoly" dielectric layer for the capacitive coupling between a floating gate patterned from a first level polycrystalline silicon and a control gate patterned from a second level polycrystalline silicon. This influence manifests itself during thermal treatments taking place after the formation of these stacked layers and depends from the way these layers were formed (temperatures, pressure, gas flow rates, residence times, growth rate).

SUMMARY OF THE INVENTION

With identical fabrication conditions, it has been observed that the reliability of a dielectric layer for instance of a tunnel oxide, in terms of breakdown, is markedly influenced by certain characteristics of the electrically conducting layer deposited over the dielectric. Surprisingly, it has been found that a layer of tunnel oxide ($SiO_2$) performs better the larger the grain size or the size of single crystal domains or crystallites of the conducting material deposited over the oxide layer. Such a conducting material is typically a doped polycrystalline silicon (polysilicon) layer.

It has been established further that a highly efficient structure is defined by interfacing, to a dielectric layer for capacitive coupling, an electrically conductive layer of doped polycrystalline silicon or equivalent electrically conductive material, having crystallization grains whose dimensions are substantially of the same size of the area of capacitive coupling to be defined. This means that, on such a coupling area, the conductive layer is of an ideally unigranular polycrystalline material or that there exists an extremely small number of distinct crystalline domains or crystallites.

It has been found that such a crystalline structure, for example of polycrystalline silicon, may be obtained by depositing an essentially amorphous silicon film at a sufficiently low temperature and crystallizing the deposited film by an annealing step conducted at a sufficiently low temperature lower than the deposition temperature, typically below 650° C. The technological research aimed to fulfill such a requirement through economically viable techniques compatible with productivity requirements, has led to establish that is it possible to form layers of polycrystalline silicon, doped or undoped, with grains of dimensions comparable to those of the relevant structural features that are defined in modern fabrication processes of integrated circuits. This may be done by using a chemical vapor phase deposition reactor capable of being operated at relatively high pressures and with controlled rapid temperature variations.

DETAILED DESCRIPTION OF THE PREFERRED EMBODIMENTS

It has been determined that the apparent amorphousness of a chemically deposited silicon film according to common deposition techniques, based on the use of low pressure chemical vapor phase deposition systems (LPCVD) is not a sufficient condition to determine, during a subsequent annealing treatment, the controlled nucleation and growth of grains of polycrystalline silicon of large dimensions in the plane of the surface and extending in a direction normal to the substrate for the whole thickness of the polycrystalline silicon layer. Usually, in chemical vapor phase deposition (CVD) processes, a critical temperature may be identified above which the deposited film appears to be crystalline and below which the film appears to be amorphous. Such a discrimination is empirically based on the results of X-ray diffractometry according to the conventional Bragg-Brentano geometry. When the resulting spectrum does not show any silicon peak, the film is said to be substantially amorphous, and vice versa.

However, though producing "amorphous" films according to normal silicon deposition techniques and to the discriminating tests as mentioned above, it has been noticed that the crystalline structure obtained during a subsequent crystallization heat treatment, even if carried out identically, appears to depend strongly upon the conditions of deposition of the amorphous film. This dependence may be explained by considering that, depending on the conditions of deposition, the film of amorphous silicon may contain different populations of more or less developed clusters of silicon atoms mutually showing a relatively coordinated arrangement. Such clusters may act as nucleation and growth sites of single crystalline grains during the crystallization phase.

It can be also observed that such precursor clusters generally form themselves at the silicon oxide interface and therefore during the first instants of the deposition. Moreover, the density of their population depends, other conditions being equal and the substrates being identical, on the temperature of deposition.

This view is further supported by observing that the above mentioned nucleation and growth mechanism originating at the silicon/substrate interface, is no longer noticed when the amorphous film is purposely subjected to a process of further amorphization. This may be done, for example, by exposing the film to ion implantation (bombardment) in a sufficient dose. Indeed, in this case, it may be observed that the nucleation and consequent growth of the crystallites originates throughout the bulk of the deposited silicon film rather than at the interface with the substrate.

In addition, following such a heavy amorphization treatment that presumably leads to the destruction of the above mentioned precursor clusters, the crystallization process is much slower. The same behavior is observed also in amorphous silicon films deposited with methods other than CVD at near-ambient temperature, as for example by sputtering. In these deposition processes the probability of generating precursor clusters appears to be neglectably small.

The probability of generating precursors of crystallites depends on the travel that a silicon atom adsorbed on the surface of the substrate may perform before completion of a substantially monatomic layer, to which the atom ultimately becomes part of and therefore upon the nature of the substrate, the temperature of deposition and the deposition speed. More precisely, it may be assumed that the probability of generating a precursor cluster increases, for identical substrates, for example, of silicon oxide, with increasing temperature and decreasing the deposition speed. Consequently, a deposition conducted at low temperatures and with relatively high rates of deposition would tend to reduce the number (density) of precursors.

The saturation density (that is, the maximum density of precursor nuclei or clusters that is obtained at a certain temperature with relatively low deposition speeds) of nuclei on the surface of a film of silicon oxide was determined at temperatures above 800° C. and found to be on the order of $10^9 \text{ cm}^{-2}$. This is three orders of magnitude higher than what would be required to obtain grains of size comparable to the dimensions of a patterned floating gate of a memory device.

To decrease the number of precursor nuclei it is necessary to work at relatively low temperatures and at sufficiently high rates of deposition to reduce the probability of formation of precursor nuclei at the interface with the substrate. In chemical vapor-phase deposition systems operating at low pressure as commonly used in the semiconductor industry, the temperature at which an acceptably low number of precursors, such as to fulfil the objectives of the present invention to produce by subsequent crystallization grains of dimensions comparable with those of the relevant structural features of the integrated structures, would be so low as to determine excessively slow deposition speeds. Accordingly, such would also be completely uneconomical in terms of productivity.

According to an aspect of the process of the invention, a layer of amorphous silicon, preferably doped during the deposition phase by mixing a dopant compound with the silicon compound gas, is produced by chemical vapor-phase deposition at a pressure higher than about 50 Torr, while maintaining the deposition temperature lower than about 700° C.

These conditions of relatively high pressure and of a proportionally reduced temperature, have been proven suitable to produce an amorphous silicon film at a sufficiently high rate of growth, generally between 1 and 5 nm/sec, and therefore in line with normal productivity requirements of a fabrication process of integrated devices on an industrial scale. It is important that the process of deposition be carried out in a system having a very low thermal inertia and permitting varying the temperature in a controlled manner. The variation gradients may be of one to few hundreds of ° C. per second and typically higher than 80° C. per second.

This requirement is of paramount importance, in particular during the cooling phase at the end of the deposition to minimize the probability of nucleation of crystallites within the bulk of the amorphous silicon film just deposited. This is also before the masking and etching steps for defining the floating gates. In practice, in the case of a polysilicon film, it is important to cool the amorphous film just deposited with a cooling rate of at least 80° C./sec and more preferably of 100° C./sec or more. A relatively low thermal inertia of the reactor is also important to better control the temperature profile during a subsequent crystallization phase.

A relatively low crystallization temperature, which typically remains below 650° C. and in any case lower than the deposition temperature of the amorphous film, during an annealing treatment carried out after having patterned the silicon film (defined the floating gates), favors the nucleation of the crystallites exclusively on relatively more developed precursor nuclei. This leads to the growth of a reduced number of crystallites of correspondingly larger sizes.

Therefore, it is possible to grow grains of large dimensions, which may have a growth along the axis normal to the film to encompass the whole film thickness. The grain dimensions on the plane of the film may be as large as about a micrometer, and thence be consistently larger or of the same order of magnitude as the dimensions of a single patterned feature of the integrated structure. This ensures a substantially unigranular characteristic (or almost unigranular) of the patterned feature itself of the integrated structure.

The fundamental importance of the silicon deposition conditions about the possibility of growing, through crystallization, grains of such dimensions is mostly due to the ability of averting the presence of an excessive number of precursor nuclei at the interface of the substrate/deposited silicon film. The precursors are formed through a casual and partially ordered aggregation of a certain number of adsorbed atoms during the initial deposition step. This mechanism is of a general nature and holds also for other films of any material deposited on any substrate.

These precursor nuclei of a subsequent growth of distinct crystalline domains or grains are difficult to be directly observed, as for example by TEM inspections, because of their extremely small size. However, their presence may be indirectly but convincingly confirmed by verifying that an ion implantation renders the layer "completely" amorphous by destroying such precursors. This changes completely the way nucleation and growth of the crystalline grains occur during an ensuing crystallization treatment.

In more detail, it may be observed that layers that would normally be regarded as amorphous according to usual analysis techniques, must be submitted to further heavy amorphousness promoting treatments to really prevent a typical nucleation of the grains originating at the film/substrate interface. Indeed, after subjecting the "apparently" amorphous film to an ion bombardment treatment a homogeneously distributed nucleation of grains throughout the bulk of the film is observed.

The rate of crystallization is also influenced by such a reduced probability of nucleation in absence of precursor nuclei. A similar nucleation pattern is observed also on "amorphous" films deposited by techniques different from chemical vapor-phase deposition. This is so, for instance, by sputtering at process temperatures where the probability for these precursors to form is negligible.

Conclusively, it may be said that films even deposited at low temperature through a chemical vapor-phase deposition step according to common techniques and apparatus cannot be considered as entirely amorphous, since there exist at the interface with the surface of the underlying substrate a dense population of precursor nuclei of crystalline grain growth. Therefore, during the subsequent crystallization process there is the nucleation at the interface of many crystalline grains which is quite negligible, under normal annealing conditions the occurrence of nucleation of grains on originating sites other than on precursors. As a consequence, in a polysilicon film, as commonly produced, it is practically impossible to generate fewer and relatively larger crystalline grains in a reproducible manner.

The improved method of the invention permits achieving important improvements of the electric parameters of insulating dielectric films interposed between two conductive layers. In particular, a decisive improvement of the charge retention characteristics in a floating gate is the most relevant advantage of devices realized according to the present invention. The invention is particularly useful to fabricate memory devices referred to as FLASH-EEPROM, in particular, to form the floating gates and eventually also the control gate structures of the integrated device.

The steps for fabricating a FLASH-EPROM device are well known and thoroughly described in literature. The document EP-A-O 614 223 (corresponding to the U.S. Pat. No. 5,497,345) describes a fabrication process of an integrated FLASH-EPROM memory device. In particular FIGS. 4 to 9 illustrate, apart from certain peculiarities of the invention therein described, a typical sequence of steps of fabrication of a FLASH-EPROM memory. U.S. Pat. No. 5,497,345 is incorporated herein by reference in its entirety.

According to the improved method of the present invention, after the growth of a tunnel oxide film in the active areas of the single memory cells (re: FIG. 4 of the above stated publication) doped silicon is deposited by chemical vapor-phase deposition. This is done using a gaseous silicon compound, such as for instance $SiH_4$, mixed with a gaseous compound of phosphorous, for instance $POCl_3$, at an absolute pressure higher that 50 Torr and at a temperature of about 650° C., for a time sufficient to deposit a layer of thickness usually between 100 to 200 nm. At the end of the deposition period, the deposit and the substrate are rapidly cooled at a rate of at least 80° C./sec, and, even more preferably, at a rate higher than 100° C./sec. The cooling may be done, for example, by jets of a refrigerating fluid (chilled air, chilled water and the like).

The film of phosphorous doped amorphous silicon is subsequently subjected to a crystallization heat treatment, by heating the wafer at a temperature of about 500–550° C. for one or more hours, growing large grains. The grains may be practically of size of the same order of magnitude as the dimensions of the openings of the mask that is used to pattern the floating gates of single memory cells in the layer of doped silicon.

The fabrication process may continue following a normal sequence of operations. After having completed the masking and definition of the polysilicon layer of first level (Poly 1), an insulating dielectric layer (or interpoly layer) is formed. This isolating dielectric interpoly layer may be realized according to well known techniques. A particularly effective technique is described in the publication EP-A-O 571 692, which relates to a procedure for the formation of a dielectric interpoly film according to a technique referred to as "oxide-nitride-oxide" (ONO), and, in particular, to an improved technique according to which a very thin film (about 15 nm) of polysilicon is deposited over a nitride layer. The polysilicon film is hence oxidized trough a rapid thermal oxidation process that leads to the formation of a dielectric film with an effective thickness of approximately 10–30 nm. The pertinent description of the above noted prior publication is herein incorporated by way of reference in its entirety.

Over the insulating multilayered interpoly dielectric film, a second amorphous polysilicon layer (Poly 2), preferably doped during the deposition phase, may be deposited by following the same steps as the improved method of the invention that was followed to deposit, crystallize and eventually pattern the Poly 1. Thereafter the FLASH-EEPROM fabrication process may resume according to the normal sequence of steps.

The decisive reduction of the number of intergranular boundary zones (or in the best of cases their total absence) within the capacitive coupling area of patterned polysilicon features with an underlying dielectric film due to the formation of floating gate structures (and eventually of control gates) of substantially unigranular doped silicon, determines a dielectric/polycrystalline silicon interface free of "asperities". The asperities would normally coincide with the intergranular zones of the polysilicon intrinsical sites of defects (critical points in terms of dielectrical behavior). This improved interface condition appears to be determinant in minimizing electric field line concentrations and in promoting enhanced electric charge retention characteristics of the charges injected in the floating gate of polysilicon (Poly 1) through the dielectric.

That which is claimed is:

1. An integrated structure comprising:

a dielectric layer; and first and second doped polycrystalline silicon layers on opposite surfaces of said dielectric layer and defining a capacitive coupling area therewith;

said first and second doped polycrystalline silicon layers having crystal grains of a size substantially a same order of magnitude as a size of the coupling area.

2. An integrated structure according to claim 1, wherein said first and second doped polycrystalline silicon layers are unigranular.

3. An integrated structure comprising:

a silicon oxide layer; and first and second doped polycrystalline silicon layers on opposite surfaces of said silicon oxide layer and defining a capacitive coupling area therewith;

said first and second doped polycrystalline silicon layers having crystal grains of a size substantially a same order of magnitude as a size of the coupling area.

4. An integrated structure according to claim 3, wherein said first and second doped polycrystalline silicon layers are unigranular.

* * * * *